(12) United States Patent
Kagawa et al.

(10) Patent No.: US 11,551,941 B2
(45) Date of Patent: Jan. 10, 2023

(54) SUBSTRATE CLEANING METHOD

(71) Applicant: Tokyo Electron Limited, Tokyo (JP)

(72) Inventors: Koji Kagawa, Koshi (JP); Meitoku Aibara, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 71 days.

(21) Appl. No.: 16/892,396

(22) Filed: Jun. 4, 2020

(65) Prior Publication Data

US 2020/0303220 A1    Sep. 24, 2020

Related U.S. Application Data

(62) Division of application No. 15/972,492, filed on May 7, 2018, now abandoned.

(30) Foreign Application Priority Data

May 9, 2017  (JP) .............................. JP2017-093005

(51) Int. Cl.
*H01L 21/67*      (2006.01)
*H01L 21/02*      (2006.01)
(Continued)

(52) U.S. Cl.
CPC .. *H01L 21/67051* (2013.01); *H01L 21/02041* (2013.01); *H01L 21/02068* (2013.01);
(Continued)

(58) Field of Classification Search
CPC ......... H01L 21/67051; H01L 21/02041; H01L 21/02068; H01L 21/67028; H01L 21/673; H01L 21/683
(Continued)

(56) References Cited

U.S. PATENT DOCUMENTS

2005/0224923 A1* 10/2005 Daley ................. H01L 21/0335
                                                         257/642
2006/0214305 A1*  9/2006 Sakata ................. C23C 16/045
                                                         257/774
(Continued)

FOREIGN PATENT DOCUMENTS

JP    2012-227291 A    11/2012

OTHER PUBLICATIONS

JP2012227291A—machine translation (Year: 2012).*

*Primary Examiner* — Tinsae B Ayalew
(74) *Attorney, Agent, or Firm* — Pearne & Gordon LLP

(57) ABSTRACT

A substrate cleaning apparatus includes a first processing unit configured to supply a first processing liquid for removing a residue adhering to a substrate onto the substrate on which a metal film is exposed at a recess of a pattern; a second processing unit configured to supply, onto the substrate, a second processing liquid for forming a protective film insoluble to the first processing liquid; a third processing unit configured to supply, onto the substrate, a third processing liquid for dissolving the protective film; and a control unit. The control unit performs forming the protective film on the metal film in a state that an upper portion of the pattern is exposed from the protective film; removing the residue adhering to the upper portion of the pattern after the forming of the protective film; and removing the protective film from the substrate after the removing of the residue.

2 Claims, 8 Drawing Sheets

(51) Int. Cl.
*H01L 21/683* (2006.01)
*H01L 21/673* (2006.01)

(52) U.S. Cl.
CPC ...... *H01L 21/673* (2013.01); *H01L 21/67028* (2013.01); *H01L 21/683* (2013.01)

(58) Field of Classification Search
USPC ....................................................... 134/95.1
See application file for complete search history.

(56) References Cited

U.S. PATENT DOCUMENTS

2011/0177462 A1\* 7/2011 Hatakeyama ........... G03F 7/325
430/325
2012/0260952 A1 10/2012 Nonaka \* cited by examiner

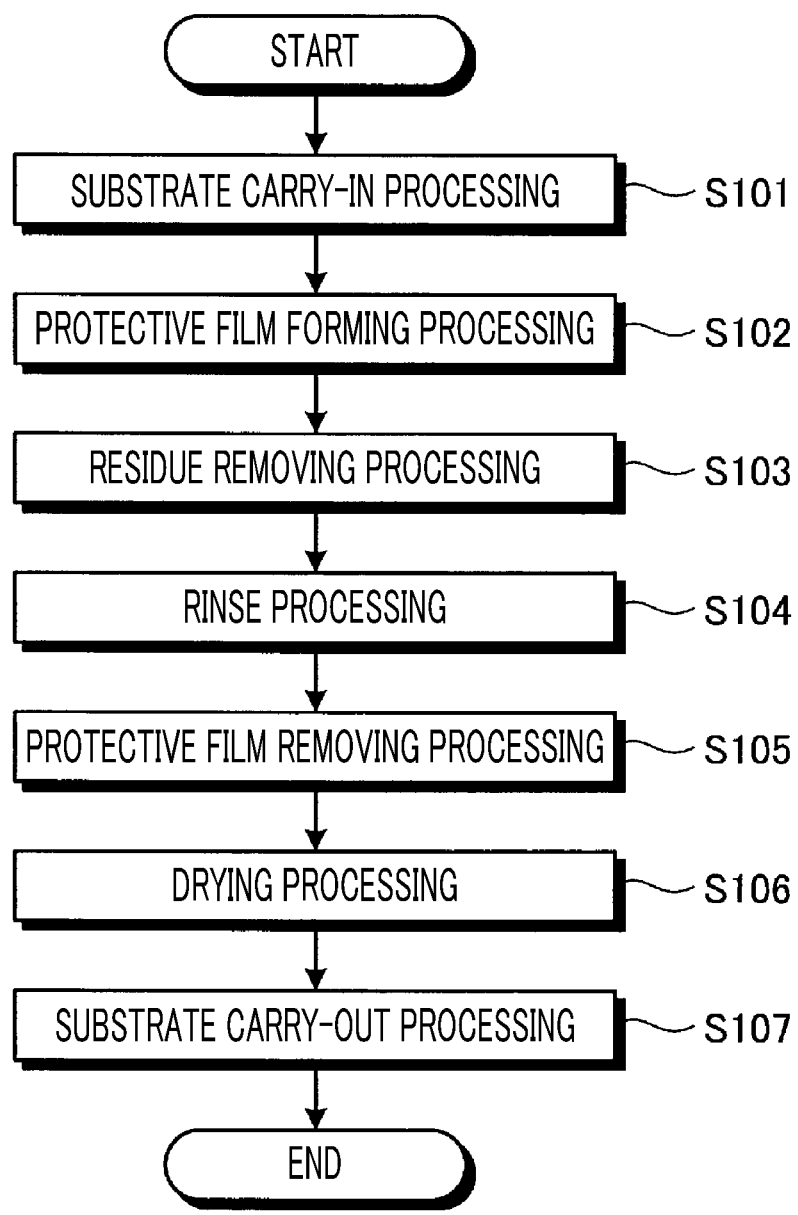

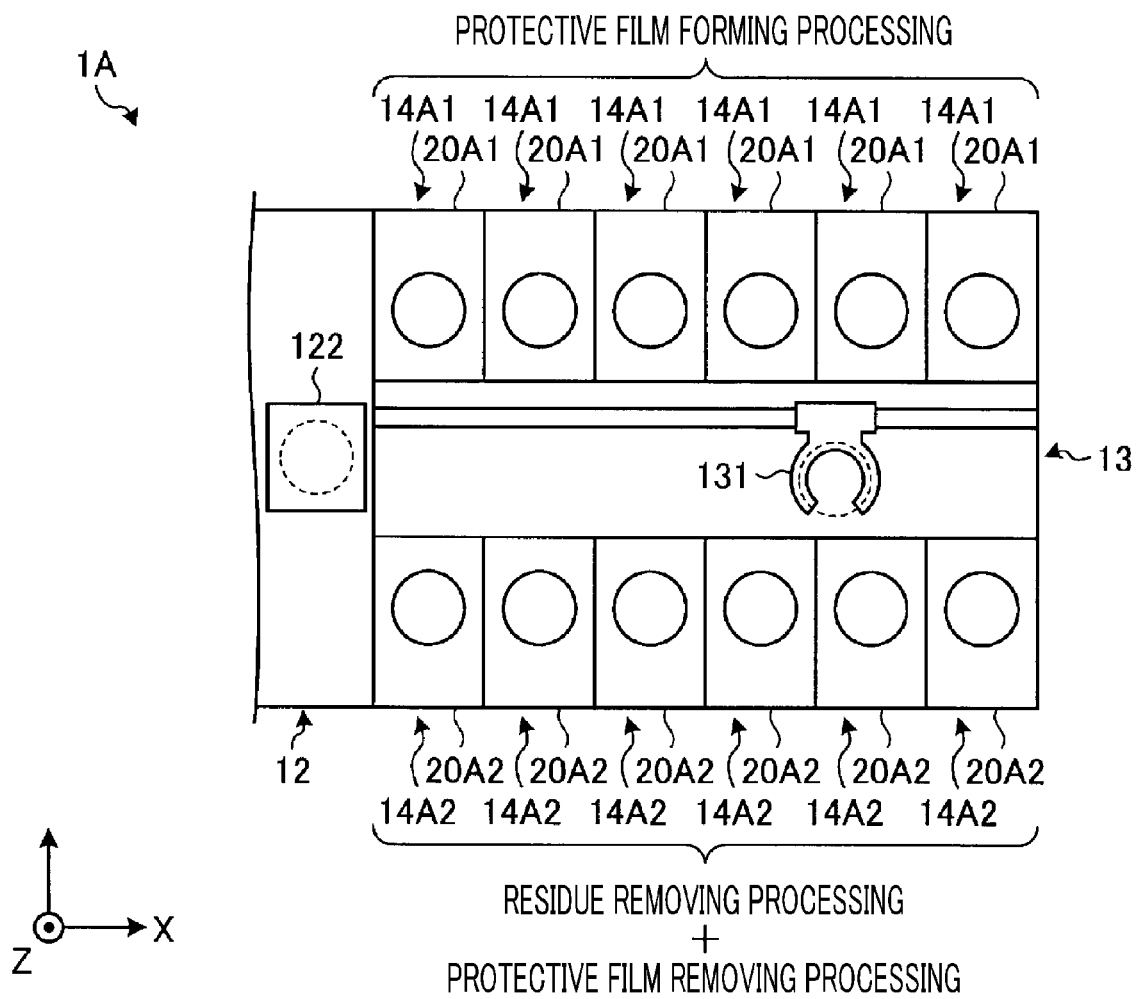

SUBSTRATE CLEANING METHOD

CROSS-REFERENCE TO RELATED APPLICATION

This is a divisional application of U.S. patent application Ser. No. 15/972,492, filed on May 7, 2018, which claims the benefit of Japanese Patent Application No. 2017-093005 filed on May 9, 2017, the entire disclosures of which are incorporated herein by reference.

TECHNICAL FIELD

The embodiments described herein pertain generally to a substrate cleaning apparatus and a substrate cleaning method.

BACKGROUND

Conventionally, there is known a substrate cleaning apparatus configured to remove a residue adhering to a substrate such as a silicon wafer or a compound semiconductor wafer by supplying a chemical liquid to the substrate.

There may be a substrate on which a metal film formed as a base film of a pattern is exposed at a recess of the pattern. When removing a residue from this substrate, a chemical liquid which hardly erodes the metal film may be used to suppress the metal film from being eroded by the chemical liquid (see, for example, Patent Document 1).

Patent Document 1: Japanese Patent Laid-open Publication No. 2012-227291

SUMMARY

Regarding the way the residue adheres to the substrate, there may be a case where the residue is attached only to an upper portion of the pattern while it is not attached to a lower portion of the pattern and the metal film, or only slightly attached thereto as compared to the upper portion of the pattern. In this case, if the chemical liquid is supplied up to the metal film, the metal film may be eroded even if the chemical liquid which hardly erodes the metal film is used as in the prior art.

In view of the foregoing, exemplary embodiments provide a substrate cleaning apparatus and a substrate cleaning method capable of removing a residue attached to an upper portion of a pattern while suppressing erosion of a metal film exposed at a recess of the pattern.

In an exemplary embodiment, a substrate cleaning apparatus includes a first processing unit, a second processing unit, a third processing unit and a control unit. The first processing unit is configured to supply a first processing liquid configured to remove a residue adhering to a substrate onto the substrate on which a pattern having protrusion and recess is formed on a metal film and the metal film is exposed at the recess of the pattern. The second processing unit is configured to supply, onto the substrate, a second processing liquid configured to form a protective film insoluble to the first processing liquid by being solidified or cured. The third processing unit is configured to supply, onto the substrate, a third processing liquid configured to dissolve the protective film. The control unit is configured to control the first processing unit, the second processing unit and the third processing unit. The control unit controls the first processing unit, the second processing unit and the third processing unit to perform a protective film forming processing of forming, by supplying the second processing liquid onto the substrate, the protective film on the metal film in a state that an upper portion of the pattern is exposed from the protective film; a residue removing processing of removing the residue adhering to the upper portion of the pattern by supplying the first processing liquid onto the substrate after being subjected to the protective film forming processing; and a protective film removing processing of removing the protective film from the substrate by supplying the third processing liquid onto the substrate after being subjected to the residue removing processing.

According to the exemplary embodiment, it is possible to remove the residue attached to the upper portion of the pattern while suppressing the erosion of the metal film exposed at the recess of the pattern.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 4 is a flowchart for describing a processing sequence of a substrate cleaning processing performed by the substrate cleaning system according to the exemplary embodiment;

FIG. 6 is a schematic diagram illustrating a configuration of a substrate cleaning apparatus according to a first modification example.

DETAILED DESCRIPTION

Figure 1:
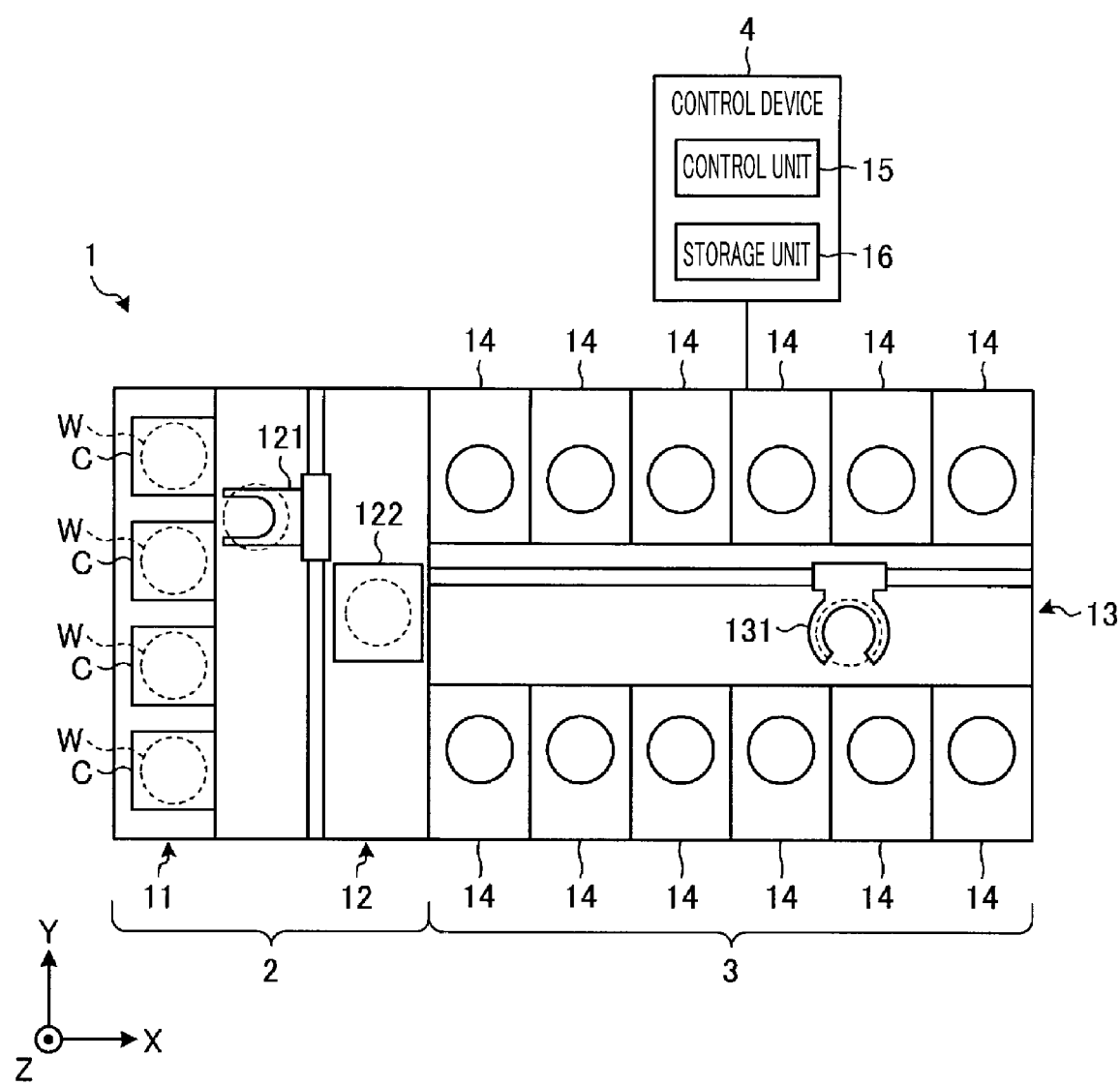
FIG. 1 is a schematic diagram illustrating a configuration of a substrate cleaning system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate cleaning apparatus and a substrate cleaning method will be explained in detail with reference to the accompanying drawings. It should be noted that the following exemplary embodiments are not intended to be anyway limiting.

1. Configuration of Substrate Cleaning System

Figure 2:
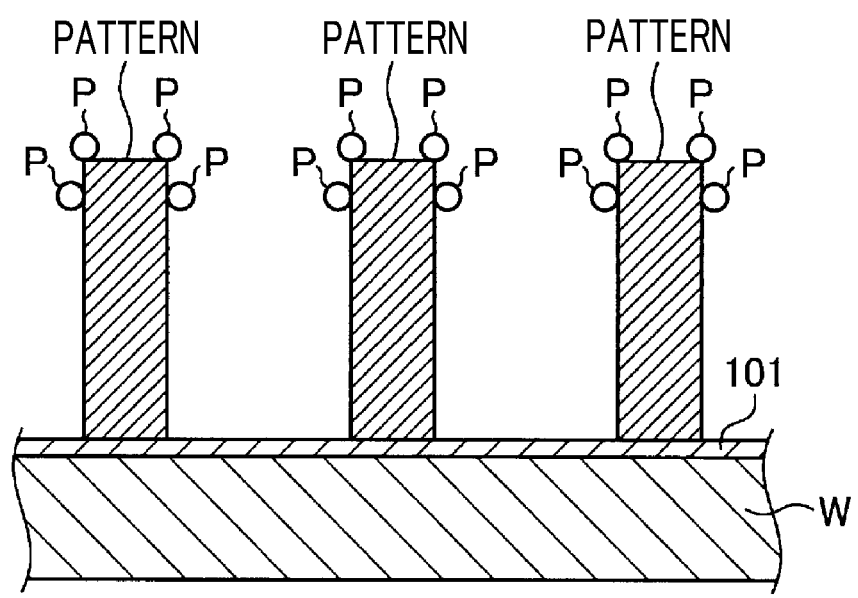
FIG. 2 is a schematic diagram illustrating a wafer according to the exemplary embodiment.

First, a configuration of a substrate cleaning system according to an exemplary embodiment will be explained. FIG. 1 is a schematic plan view illustrating an outline of the substrate cleaning system according to the exemplary embodiment, and FIG. 2 is a schematic diagram illustrating a wafer according to the exemplary embodiment. Further, in the following description, in order to clarify positional relationships, the X-axis, Y-axis and Z-axis which are orthogonal to each other will be defined. The positive Z-axis direction will be regarded as a vertically upward direction.

As shown in FIG. 1, a substrate cleaning system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of transfer container (hereinafter referred to as "carriers C") is placed to accommodate a plurality of wafers W horizontally.

The transfer section 12 is provided adjacent to the carrier placing section 11, and provided with a substrate transfer device 121 and a delivery unit 122.

The substrate transfer device 121 is provided with a wafer holding mechanism configured to hold the wafer W. Further, the substrate transfer device 121 is movable horizontally and vertically and pivotable around a vertical axis, and transfers the wafers W between the carriers C and the delivery unit 122 by using the wafer holding mechanism.

The processing station 3 is provided adjacent to the transfer section 12. The processing station 3 is provided with a transfer section 13 and a plurality of substrate cleaning apparatuses 14. These substrate cleaning apparatuses 14 are arranged at both sides of the transfer section 13.

The transfer section 13 is provided with a substrate transfer device 131 therein. The substrate transfer device 131 is provided with a wafer holding mechanism configured to hold the wafer W. Further, the substrate transfer device 131 is movable horizontally and vertically and pivotable around a vertical axis. The substrate transfer device 131 transfers the wafers W between the delivery unit 122 and the substrate cleaning apparatuses 14 by using the wafer holding mechanism.

Each of the substrate cleaning apparatuses 14 is configured to perform a substrate cleaning processing of removing a residue obtained after a dry etching, for example, from the wafer W.

To elaborate, the wafer W according to the present exemplary embodiment is a silicon wafer or a compound semiconductor wafer in which a pattern having protrusion and recess is formed on the metal film 101, as illustrated in FIG. 2, and the metal film 101 is exposed at the recess of the pattern. The residue P is attached to an upper portion of the pattern on this wafer W. Here, the term "upper portion of the pattern" refers to a top surface of the protrusion of the pattern having the protrusion and the recess; and a side surface portion of the pattern adjacent to the top surface of the protrusion. Further, the term "protrusion of the pattern" refers to an upper half portion of the pattern in a height direction thereof, and the term "recess of the pattern" refers to a portion formed by lower half portions of two neighboring patterns in the height direction and the metal film 101. Though FIG. 2 illustrates an example where the metal film 101 is exposed at a bottom surface of the recess of the pattern, the metal film 101 may be exposed at any position of the recess of the pattern.

Further, although the residue P may be attached to the lower portion of the pattern and the metal film 101 as well, the residue P attached to the lower portion of the pattern and the metal film 101 is very small in amount as compared to the residue P attached to the upper portion of the pattern, and thus need not be removed.

In case of removing the residue P which is dominantly attached to the upper portion of the pattern, when a chemical liquid for removing the residue P is supplied up to the metal film 101, the metal film 101 may be unnecessarily eroded even if the chemical liquid which hardly erodes the metal film 101 is used.

In this regard, in the substrate cleaning apparatus 14 according to the present exemplary embodiment, the residue P at the upper portion of the pattern is removed by supplying the chemical liquid onto the wafer W in a state that the metal film 101 is covered with a protective film. Accordingly, it is possible to remove the residue P while suppressing the erosion of the metal film 101. A specific configuration and an operation of the substrate cleaning apparatus 14 will be explained later.

Further, the substrate cleaning system 1 is provided with a control device 4. The control device 4 is configured to control operations of the substrate cleaning system 1. This control device 4 is, for example, a computer, and includes a control unit 15 and a storage unit 16. The storage unit 16 stores a program that controls various processings such as a substrate cleaning processing. The control unit 15 controls the operations of the substrate cleaning system 1 by reading and executing the program stored in the storage unit 16. The control unit 15 may be implemented by, by way of non-limiting example, a CPU (Central Processing Unit) or a MPU (Micro Processor Unit), and the storage unit 16 may be implemented by, but not limited to, a ROM (Read Only Memory) or a RAM (Random Access Memory).

Further, the program may be recorded in a computer-readable recording medium and installed from the recording medium to the storage unit 16 of the control device 4. The computer-readable recording medium may be, for example, a hard disc (HD), a flexible disc (FD), a compact disc (CD), a magnet optical disc (MO), or a memory card.

In the substrate cleaning system 1 configured as described above, the substrate transfer device 121 of the carry-in/out station 2 first takes out a wafer W from a carrier C, and then places the taken wafer W on the delivery unit 122. The wafer W placed on the delivery unit 122 is taken out from the delivery unit 122 by the substrate transfer device 131 of the processing station 3 and carried into a substrate cleaning apparatus 14 in which a substrate cleaning processing is performed. Then, the cleaned wafer W is taken out of the substrate cleaning apparatus 14 by the substrate transfer device 131 and placed on the delivery unit 122, and returned back into the carrier C by the substrate transfer device 121.

2. Configuration of Substrate Cleaning Apparatus

Figure 3:
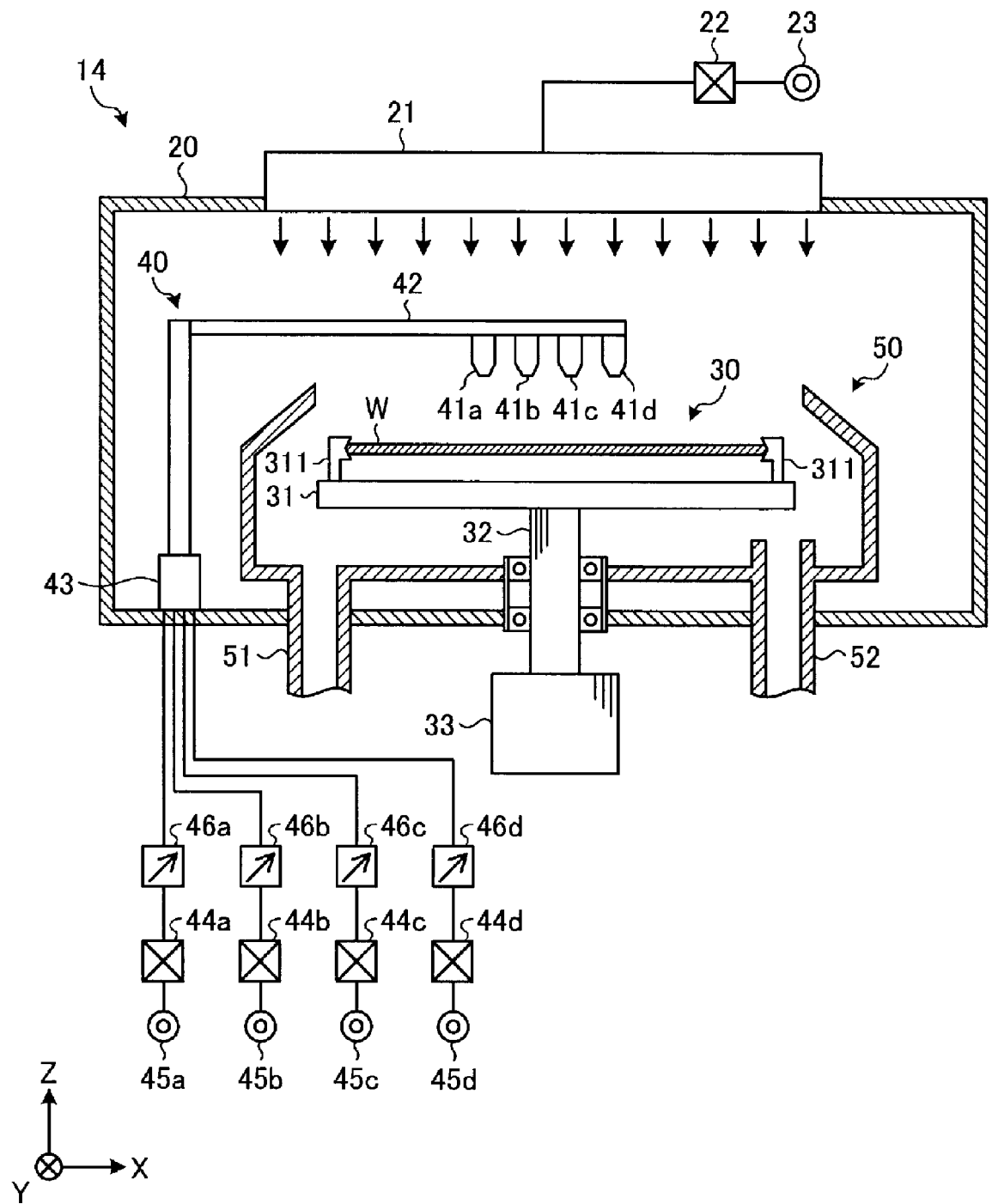
FIG. 3 is a schematic diagram illustrating a configuration of a substrate cleaning apparatus according to the exemplary embodiment.

Now, the configuration of the substrate cleaning apparatus 14 will be explained with reference to FIG. 3. FIG. 3 is a schematic diagram illustrating the configuration of the substrate cleaning apparatus 14 according to the present exemplary embodiment.

As illustrated in FIG. 3, the substrate cleaning apparatus 14 is provided with a chamber 20, a substrate holding mechanism 30, a liquid supply unit 40, and a recovery cup 50.

The chamber 20 accommodates the substrate holding mechanism 30, the liquid supply unit 40, and the recovery cup 50. A fan filter unit (FFU) 21 is provided on the ceiling of the chamber 20. The FFU 21 forms a downflow in the chamber 20.

The FFU 21 is connected to a downflow gas supply source 23 via a valve 22. The FFU 21 discharges a downflow gas (e.g., dry air) supplied from the downflow gas supply source 23 into the chamber 20.

The substrate holding mechanism 30 is provided with a rotating/holding unit 31, a support unit 32, and a driving unit 33. The rotating/holding unit 31 is provided at a substantially central portion of the chamber 20. A holding member 311 configured to hold the wafer W from the side is provided at a top surface of the rotating/holding unit 31. The wafer W is horizontally held by this holding member 311 while being slightly spaced apart from the top surface of the rotating/holding unit 31.

The support unit 32 is a vertically extending member, and has a base end portion supported rotatably by the driving unit 33 and a tip end portion supporting the rotating/holding unit 31 horizontally. The driving unit 33 rotates the support unit 32 around the vertical axis.

The substrate holding mechanism 30 rotates the support unit 32 by using the driving unit 33, so that the rotating/holding unit 31 supported by the support unit 32 is rotated, and hence, the wafer W held by the rotating/holding unit 31 is rotated.

Furthermore, the rotating/holding unit 31 is not limited to the aforementioned type configured to hold the wafer W from the side but may be of a type such as, but not limited to, a vacuum chuck configured to attract and hold the wafer W from below.

The liquid supply unit 40 supplies various kinds of processing liquids onto the wafer W held by the substrate holding mechanism 30. The liquid supply unit 40 is equipped with a plurality of (here, four) nozzles 41a to 41d; an arm 42 supporting the nozzles 41a to 41d horizontally; and a rotating/elevating mechanism 43 configured to rotate and move the arm 42 up and down.

The nozzle 41a is connected to a chemical liquid supply source 45a via a valve 44a and a flow rate controller 46a. The nozzle 41b is connected to a film formation processing liquid supply source 45b via a valve 44b and a flow rate controller 46b. The nozzle 41c is connected to a rinse liquid supply source 45c via a valve 44c and a flow rate controller 46c. The nozzle 41d is connected to a dissolution processing liquid supply source 45d via a valve 44d and a flow rate controller 46d.

The chemical liquid supplied from the chemical liquid supply source 45a is discharged from the nozzle 41a. The chemical liquid corresponds to a first processing liquid which removes the residue P adhering to the wafer W. By way of non-limiting example, DHF (Dilute Hydrofluoric Acid), SC1 (a mixed solution of ammonia, hydrogen peroxide and water), DSP (Diluted Sulfuric Acid Peroxide Mixture) or the like may be used as the chemical liquid.

The film formation processing liquid supplied from the film formation processing liquid supply source 45b is discharged from the nozzle 41b. The film formation processing liquid corresponds to a second processing liquid which forms a protective film insoluble to the first processing liquid by being solidified (solidification) or cured (curing). Here, the term "solidification" means being changed into a solid, and the term "curing" means being polymerized as molecules are bonded (for example, cross-linking, polymerization, or the like).

It is desirable that a liquid containing a compound having a fluorine atom is used as the film formation processing liquid, for this liquid is capable of suppressing water from permeating the protective film by a water repellent effect of the fluorine atom. To elaborate, desirably, a liquid containing a polymer having a structural unit containing a fluorine atom as indicated by Chemical Formula 1 may be used as the film formation processing liquid.

[Chemical Formula 1]

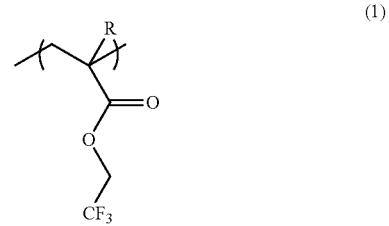

(1)

In the above Chemical Formula 1, R denotes an alkyl group. The alkyl group may have a carbon number ranging from 1 to 8.

Further, the film formation processing liquid contains a solvent which dissolves the polymer. This solvent may be, by way of example, but not limitation, an organic solvent such as an alcohol-based solvent, an ether-based solvent, a ketone-based solvent, an amide-based solvent, an ester-based solvent or a hydrocarbon-based solvent, or water. Among these, the organic solvent is desirable.

The rinse liquid supplied from the rinse liquid supply source 45c is discharged from the nozzle 41c. The rinse liquid may be, by way of example, DIW (pure water).

The dissolution processing liquid supplied from the dissolution processing liquid supply source 45d is discharged from the nozzle 41d. The dissolution processing liquid corresponds to a third processing liquid which dissolves the protective film. By way of non-limiting example, an organic solvent such as IPA (isopropyl alcohol), thinner, MIBC (4-methyl-2-pentanol), toluene, acetic acid esters, alcohols, glycols (propylene glycol monomethyl ether), or the like is used as the dissolution processing liquid.

Here, in the preset exemplary embodiment, IPA heated to a preset temperature (e.g., 65° C.) is used as the dissolution processing liquid. Alternatively, IPA of a room temperature may be used as the dissolution processing liquid. Further, the dissolution processing liquid is not limited to the organic solvent but may be, for example, an alkaline developing solution, an acidic developing solution, or the like.

The recovery cup 50 is disposed to surround the rotating/holding unit 31, and collects the processing liquid scattered from the wafer W by the rotation of the rotating/holding unit 31. A drain port 51 is formed on the bottom of the recovery cup 50, and the processing liquid collected by the recovery cup 50 is discharged from the drain port 51 to the outside of the substrate cleaning apparatus 14. Further, an exhaust port 52 is formed on the bottom of the recovery cup 50 to discharge the downflow gas supplied from the FFU 21 to the outside of the substrate cleaning apparatus 14.

Further, the number of the nozzles provided in the substrate cleaning apparatus 14 may not be limited to the aforementioned example, and the substrate cleaning apparatus 14 may be equipped with a single nozzle configured to discharge the chemical liquid, the film formation processing liquid, the rinse liquid and the dissolution processing liquid.

3. Specific Operation of Substrate Cleaning System

Figure 5A:
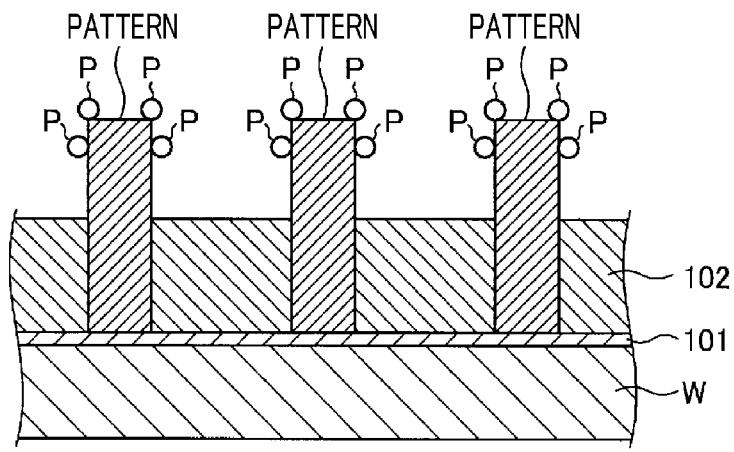
FIG. 5A is a diagram for describing a protective film forming processing.
Figure 5B:
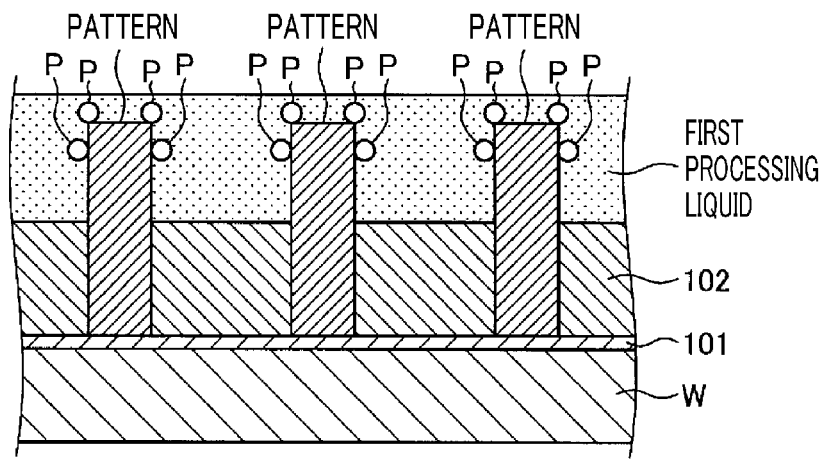
FIG. 5B is a diagram for describing a residue removing processing.
Figure 5C:
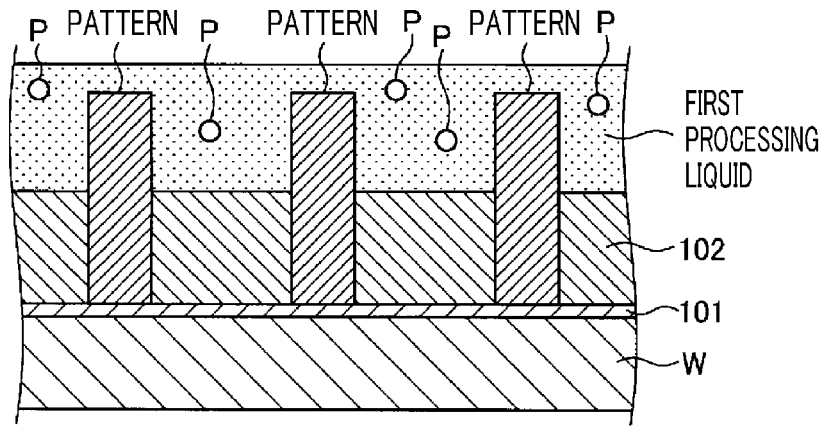
FIG. 5C is a diagram for describing the residue removing processing.
Figure 5D:
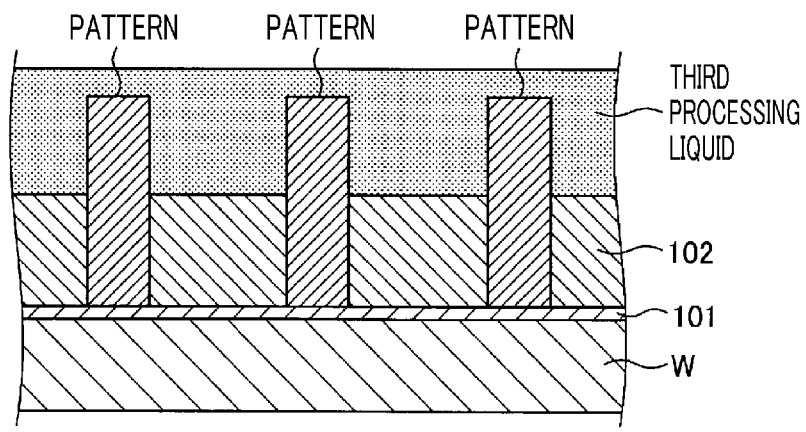
FIG. 5D is a diagram for describing a protective film removing processing.
Figure 5E:
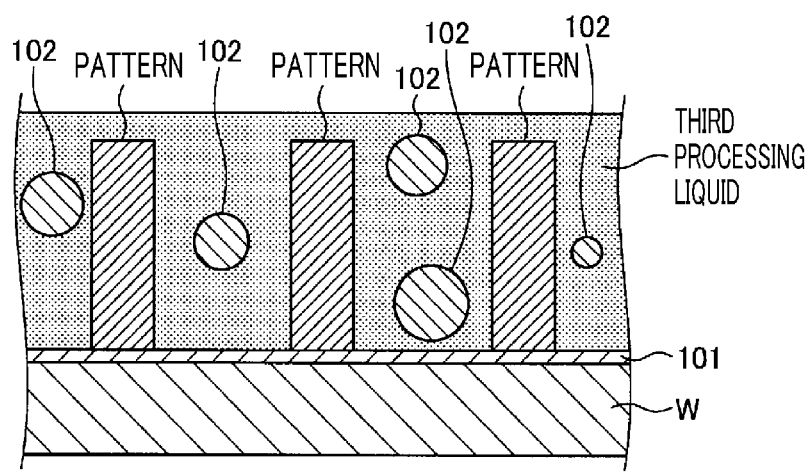
FIG. 5E is a diagram for describing the protective film removing processing.
Figure 5F:
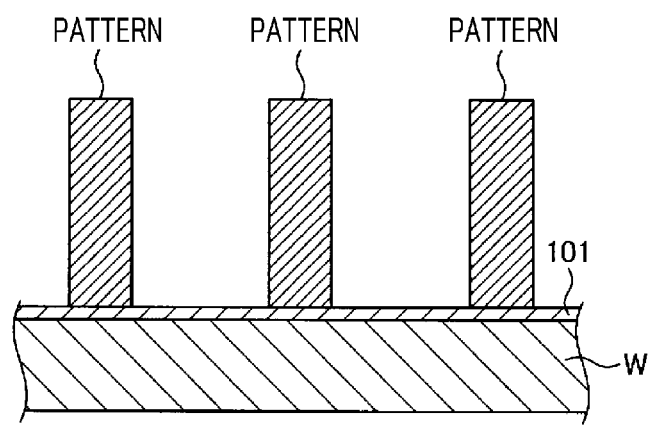
FIG. 5F is a schematic diagram of the wafer after a drying processing is performed.

Now, a specific operation of the substrate cleaning apparatus 14 will be discussed with reference to FIG. 4 and FIG. 5A to FIG. 5F. FIG. 4 is a flowchart illustrating a processing sequence of a substrate cleaning processing performed by the substrate cleaning system 1 according to the present exemplary embodiment. Further, FIG. 5A is a diagram for describing a protective film forming processing; FIG. 5B and FIG. 5C are diagrams for describing a residue removing processing; FIG. 5D and FIG. 5E are diagrams for describing a protective film removing processing; FIG. 5F is a diagram illustrating the wafer W after a drying processing is performed. The individual components belonging to the substrate cleaning system 1 perform the processing sequence shown in FIG. 4 under the control of the control unit 15.

As shown in FIG. 4, in the substrate cleaning apparatus 14, a substrate carry-in processing is first performed (process S101). In this substrate carry-in processing, the wafer W carried into the chamber 20 by the substrate transfer device 131 (see FIG. 1) is held by the holding member 311 of the substrate holding mechanism 30. At this time, the wafer W is held by the holding member 311 with a pattern formation surface thereof facing upwards. Thereafter, the rotating/holding unit 31 is rotated by the driving unit 33. Accordingly, the wafer W is rotated along with the rotating/holding unit 31 while being horizontally held by the rotating/holding unit 31. A rotation number of the wafer W is set to a first rotation number.

Subsequently, in the substrate cleaning apparatus 14, the protective film forming processing is performed (process S102). In this protective film forming processing, the nozzle 41b of the liquid supply unit 40 is placed above a center of the wafer W. Thereafter, as the valve 44b is opened for a preset time, the film formation processing liquid is supplied onto the pattern formation surface of the wafer W.

The film formation processing liquid supplied onto the wafer W is diffused on the surface of the wafer W by a centrifugal force generated by the rotation of the wafer W. Accordingly, a liquid film of the film formation processing liquid is formed on the pattern formation surface of the wafer W. As a part of or all of the organic solvent included in the film formation processing liquid is vaporized and a solid content contained in the film formation processing liquid is solidified or cured, a protective film 102 covering the metal film 101 is formed in a state that an upper portion of a pattern is exposed, as illustrated in FIG. 5A.

Here, the first rotation number, which is the rotation number of the wafer W in the protective film forming processing, is set to be higher than rotation numbers of the wafer W in the residue removing processing, the rinse processing and the protective film removing processing to be performed later. Accordingly, it is possible to form the protective film 102 having a thickness (e.g., 25 nm or less) where the upper portion of the pattern on the wafer W is allowed to be exposed.

As stated above, the nozzle 41b, the arm 42, the rotating/elevating mechanism 43, the valve 44b and the flow rate controller 46b correspond to an example of a second processing unit configured to supply the second processing liquid onto the wafer W.

Further, in the substrate cleaning apparatus 14, a pre-wet processing may be performed prior to conducting the protective film forming processing (process S102) after the substrate carry-in processing (process S101) is performed. In the pre-wet processing, the nozzle 41d of the liquid supply unit 40 is placed above the center of the wafer W. Then, as the valve 44d is opened for a preset time, the IPA is supplied onto the pattern formation surface of the wafer W. The IPA supplied onto the wafer W is diffused on the pattern formation surface of the wafer W by the centrifugal force generated by the rotation of the wafer W.

The film formation processing liquid has high water repellency. Thus, even if the film formation processing liquid is supplied onto the wafer W after being subjected to the chemical liquid processing, the film formation processing liquid may float on the DIW remaining on the surface of the wafer W. Therefore, it may take a long time to form the liquid film of the film formation processing liquid on the surface of the wafer W.

In view of this problem, by coating the wafer W with the IPA having affinity to the film formation processing liquid, the film formation processing liquid is allowed to be easily diffused on the top surface of the wafer W in the protective film forming processing and, also, enter a gap of the pattern easily. Accordingly, the consumption amount of the film formation processing liquid can be reduced, and the protective film 102 covering the metal film 101 can be formed more securely. Furthermore, a processing time of the protective film forming processing can be shortened.

The processing liquid used in the pre-wet processing may not be limited to the IPA, but an organic solvent other than the IPA, such as ethanol or acetone, may be used.

Furthermore, in the protective film forming processing, an acceleration processing of accelerating the solidification or curing of the film formation processing liquid may be performed. By way of example, the acceleration processing may be a drying processing of drying the film formation processing liquid by increasing a rotational speed of the wafer W for a preset time period. Alternatively, the acceleration processing may be a processing of decompressing the chamber 20 by a non-illustrated decompressing apparatus, or a processing of reducing a humidity within the chamber 20 by the downflow gas supplied from the FFU 21.

Subsequently, in the substrate cleaning apparatus 14, the residue removing processing is performed (process S103). In the residue removing processing, the nozzle 41a of the liquid supply unit 40 is placed above the center of the wafer W. Further, the rotation number of the wafer W is reduced to a second rotation number from the first rotation number. Thereafter, as the valve 44a is opened for a preset time, the chemical liquid such as DHF is supplied onto the wafer W. The chemical liquid supplied onto the wafer W is diffused on the pattern formation surface of the wafer W by the centrifugal force generated by the rotation of the wafer W (see FIG. 5B). The residue P having reacted with the DHF is separated from the surface of the wafer W to be dissolved, so that the residue P adhering to the upper portion of the pattern is removed (see FIG. 5C).

Here, in the residue removing processing, the metal film 101 is covered with the protective film 102. The protective film 102 covering the metal film 101 is insoluble to the chemical liquid supplied onto the wafer W in the residue removing processing. Thus, the metal film 101 can be suppressed from being eroded by the chemical liquid during the residue removing processing.

As stated above, the nozzle 41a, the arm 42, the rotating/elevating mechanism 43, the valve 44a and the flow rate controller 46a correspond to an example of a first processing unit configured to supply the first processing liquid onto the wafer W.

Subsequently, in the substrate cleaning apparatus 14, the rinse processing is performed (process S104). In the rinse processing, the nozzle 41c of the liquid supply unit 40 is placed above the center of the wafer W. Then, as the valve 44c is opened for a preset time, the DIW as the rinse liquid is supplied onto the wafer W. The DIW supplied onto the wafer W is diffused on the pattern formation surface of the wafer W by the centrifugal force generated by the rotation of the wafer W. Accordingly, the chemical liquid remaining on the wafer W is washed away by the DIW.

Thereafter, the protective film removing processing is performed in the substrate cleaning apparatus 14 (process S105). In the protective film removing processing, the nozzle 41d of the liquid supply unit 40 is placed above the center of the wafer W. Then, as the valve 44d is opened for a preset time, the IPA as the dissolution processing liquid is supplied onto the wafer W. The IPA supplied onto the wafer W is diffused on the surface of the wafer W by the centrifugal force generated by the rotation of the wafer W (see FIG. 5D). Accordingly, the protective film 102 is dissolved and removed from the wafer W (see FIG. 5E).

As stated above, the nozzle 41d, the arm 42, the rotating/elevating mechanism 43, the valve 44d and the flow rate controller 46d correspond to an example of a third processing unit configured to supply a third processing liquid onto the wafer W.

Subsequently, in the substrate cleaning apparatus 14, the drying processing is performed (process S106). In the drying processing, by increasing the rotation number of the wafer W to a third rotation number from the second rotation number, the DIW remaining on the surface of the wafer W is scattered, so that the wafer W is dried (see FIG. 5F). Here, the third rotation number is set to be higher than the first rotation number.

Subsequently, in the substrate cleaning apparatus 14, a substrate carry-out processing is performed (process S107). In this substrate carry-out processing, the wafer W is taken out of the chamber 20 of the substrate cleaning apparatus 14 by the substrate transfer device 131 (see FIG. 1). Then, the wafer W is accommodated into the carrier C placed on the carrier placing section 11 via the delivery unit 122 and the substrate transfer device 121. Upon the completion of this substrate carry-out processing, the substrate cleaning processing upon the single sheet of wafer W is ended.

4. Modification Example

The above exemplary embodiment has been described for the example case where the nozzle 41a of the first processing unit, the nozzle 41b of the second processing unit and the nozzle 41d of the third processing unit are provided in the single chamber 20. However, the configuration of the substrate cleaning apparatus 14 is not limited to this example. In the following, a configuration of the substrate cleaning apparatus 14 according to modification examples will be explained.

First, a configuration of a substrate cleaning apparatus according to a first modification example will be described with reference to FIG. 6. FIG. 6 is a schematic diagram illustrating the configuration of the substrate cleaning apparatus according to the first modification example. Further, in the following description, same parts as those already described will be assigned same reference numerals, and redundant description will be omitted.

As illustrated in FIG. 6, a substrate cleaning system 1A according to the first modification example includes first substrate cleaning apparatuses 14A1 each configured to perform the protective film forming processing and second substrate cleaning apparatuses 14A2 each configured to perform the residue removing processing and the protective film removing processing.

Each first substrate cleaning apparatus 14A1 is equipped with a first chamber 20A1. The first chamber 20A1 accommodates therein the nozzle 41b configured to supply the film formation processing liquid, the arm 42 and the rotating/elevating mechanism 43. To be more specific, the first substrate cleaning apparatus 14A1 has a configuration in which the nozzles 41a, 41c and 41d, the valves 44a, 44c and 44d, the flow rate controllers 46a, 46c and 46d, the chemical liquid supply source 45a, the rinse liquid supply source 45c and the dissolution processing liquid supply source 45d are omitted from the substrate cleaning apparatus 14 shown in FIG. 3

Each second substrate cleaning apparatus 14A2 is equipped with a second chamber 20A2. The second chamber 20A2 accommodates therein the nozzle 41a configured to supply the chemical liquid, the nozzle 41c configured to supply the rinse liquid, the nozzle 41d configured to supply the dissolution processing liquid, the arm 42 and the rotating/elevating mechanism 43. To be more specific, the second substrate cleaning apparatus 14A2 has a configuration in which the nozzle 41b, the valve 44b, the flow rate controller 46b and the film formation processing liquid supply source 45b are omitted from the substrate cleaning apparatus 14 shown in FIG. 3. Further, the first substrate cleaning apparatus 14A1 and the second substrate cleaning apparatus 14A2 correspond to an example of the substrate cleaning apparatus.

In this substrate cleaning system 1A, the substrate carry-in processing (process S101) and the protective film forming processing (process S102) shown in FIG. 4 are performed in the first substrate cleaning apparatus 14A1, and the processings (processes S103 to S107) from the residue removing processing are performed in the second substrate cleaning apparatus 14A2. Further, in the substrate cleaning system 1A, a processing of taking out the wafer W from the first substrate cleaning apparatus 14A1 and carrying the taken wafer W into the second substrate cleaning apparatus 14A2 is performed by using the substrate transfer device 131 before the residue removing processing of the process S103 and after the protective film forming processing of the process S102 is performed.

Figure 7:
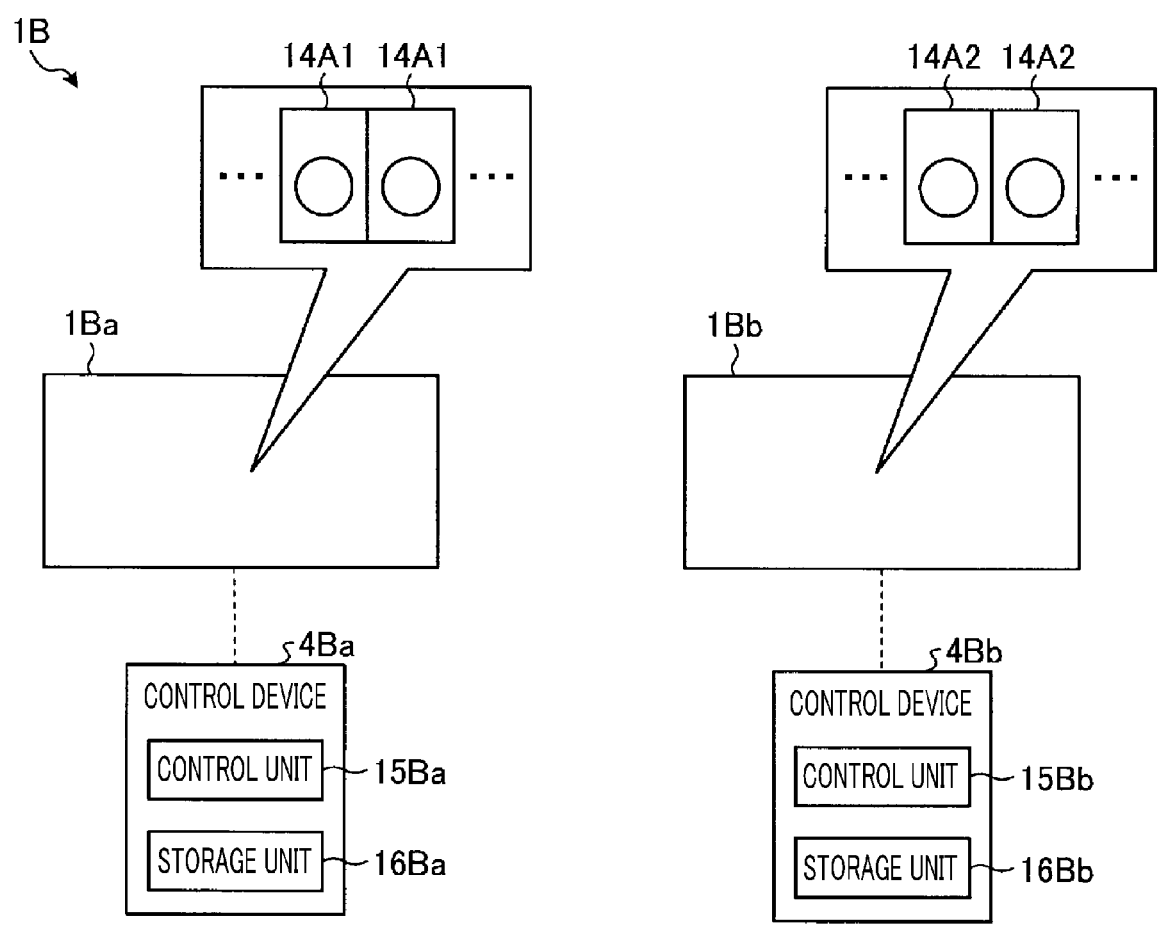
FIG. 7 is a schematic diagram illustrating a configuration of a substrate cleaning apparatus according to a second modification example.

Now, a configuration of a substrate cleaning apparatus according to a second modification example will be described with reference to FIG. 7. FIG. 7 is a schematic diagram illustrating the configuration of the substrate processing apparatus according to the second modification example.

As illustrated in FIG. 7, a substrate cleaning system 1B according to the second modification example includes a first processing apparatus 1Ba equipped with the multiple first substrate cleaning apparatuses 14A1 and a second processing apparatus 1Bb equipped with the multiple second substrate cleaning apparatuses 14A2. To elaborate, the first processing apparatus 1Ba has a configuration in which the multiple first substrate cleaning apparatuses 14A1 are arranged in the processing station 3 of the substrate cleaning system 1 shown in FIG. 1. Likewise, the second processing apparatus 1Bb has a configuration in which the multiple second substrate cleaning apparatuses 14A2 are arranged in the processing station 3 of the substrate cleaning system 1 shown in FIG. 1.

Further, the substrate cleaning system 1B is equipped with a control device 4Ba and a control device 4Bb. The control device 4Ba is provided with a control unit 15Ba and a storage unit 16Ba, and configured to control operations of the first processing apparatuses 1Ba. Further, the control device 4Bb is provided with a control unit 15Bb and a storage unit 16Bb, and configured to control operations of the second processing apparatuses 1Bb.

In this substrate cleaning system 1B, after the substrate carry-in processing (process S101) and the protective film forming processing (process S102) shown in FIG. 4 are performed in the first substrate cleaning apparatus 14A1 of the first processing apparatus 1Ba, the wafer W after being subjected to the protective film forming processing is carried out of the first substrate cleaning apparatus 14A1 and returned back into the carrier C. Then, the carrier C is moved to the second processing apparatus 1Bb, and the processings (processes S103 to S107) from the residue removing processing are performed in the second substrate cleaning apparatus 14A2 of the second processing apparatus 1Bb.

As stated above, the first to third processing units need not necessarily provided in the single chamber. By way of example, the second processing unit may be provided in a separate chamber.

With this configuration, by performing the protective film forming processing in the first substrate cleaning apparatus 14A1 in advance and thus creating the state in which the metal film 101 is covered with the protective film 102, Q-time management for suppressing oxidation of the metal film 101, that is, time management or line management for keeping a Q-time can be easily performed. Therefore, productivity can be improved.

As discussed above, the substrate cleaning apparatus according to the present exemplary embodiment (the substrate cleaning apparatus 14, the first substrate cleaning apparatus 14A1, and the second substrate cleaning apparatus 14A2) is equipped with the first processing unit (the nozzle 41a, the arm 42, the rotating/elevating mechanism 43, the valve 44a and the flow rate controller 46a); the second processing unit (the nozzle 41b, the arm 42, the rotating/elevating mechanism 43, the valve 44b and the flow rate controller 46b); the third processing unit (the nozzle 41d, the arm 42, the rotating/elevating mechanism 43, the valve 44d and the flow rate controller 46d); and the control unit (the control unit 15, the control unit 15Ba, or the control unit 15Bb). The first processing unit supplies the first processing liquid (chemical liquid such as DHF or SC1) configured to remove the residue adhering to the substrate onto the substrate (wafer W) on which the metal film is exposed at the recess of the pattern having the protrusion and the recess. The second processing unit supplies, onto the substrate, the second processing liquid (film formation processing liquid) configured to form the protective film insoluble to the first processing liquid by being solidified or cured. The third processing unit supplies, onto the substrate, the third processing liquid (dissolution processing liquid such as IPA) configured to dissolve the protective film. The control unit controls the first processing unit, the second processing unit and the third processing unit. Further, the control unit controls the first processing unit, the second processing unit and the third processing unit to perform the protective film forming processing of forming, by supplying the second processing liquid onto the substrate, the protective film on the metal film in the state that the upper portion of the pattern is exposed from the protective film; the residue removing processing of removing the residue adhering to the upper portion of the pattern by supplying the first processing liquid onto the substrate after being subjected to the protective film forming processing; and the protective film removing processing of removing the protective film 102 from the substrate by supplying the third processing liquid onto the substrate after being subjected to the residue removing processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate cleaning method, comprising:
providing a substrate on which a pattern having protrusion and recess is formed on a metal film and the metal film is exposed at the recess of the pattern;
a protective film forming processing of forming a protective film on the metal film by supplying, onto the substrate, a second processing liquid configured to form a protective film such that an upper portion of the protrusion of the pattern is protruded from an upper surface of the protective film;
a residue removing processing of removing a residue adhering to the upper portion of the pattern on the substrate by supplying a first processing liquid configured to remove the residue adhering to the substrate onto the substrate after being subjected to the protective film forming processing, the protective film being insoluble to the first processing liquid; and
a protective film removing processing of removing the protective film from the substrate by supplying, onto the substrate after being subjected to the residue removing processing, a third processing liquid configured to dissolve the protective film while leaving an entire portion of the metal film intact,
wherein the second processing liquid contains a compound having a fluorine atom,
wherein the compound is represented by Chemical Formula 1 as follows, and

[Chemical Formula 1]
[Chemical Formula 1]
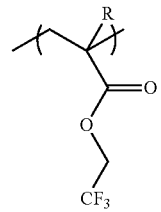
(1)
R denotes an alkyl group.
2. The substrate cleaning method of claim 1, wherein the third processing liquid is an organic solvent.
\* \* \* \* \*